(12) United States Patent
Horng et al.

(10) Patent No.: US 6,550,529 B1
(45) Date of Patent: Apr. 22, 2003

(54) HEATSINK DEVICE

(75) Inventors: Alex Horng, Kaohsiung (TW); Ching-Sheng Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 10/123,279

(22) Filed: Apr. 17, 2002

(51) Int. Cl.7 .................................................. F28F 7/00
(52) U.S. Cl. ................. 165/80.3; 165/185; 165/104.33; 165/104.26; 361/700; 361/697; 257/715
(58) Field of Search ............................... 165/80.3, 185; 361/704, 709, 710, 695, 697

(56) References Cited

U.S. PATENT DOCUMENTS

| | | | | |
|---|---|---|---|---|
| 2,216,778 A | * | 10/1940 | Houdry | 165/183 |
| 2,574,142 A | * | 11/1951 | Buongirno | 165/185 |
| 2,585,912 A | * | 2/1952 | Buschow et al. | 165/185 |
| 3,189,087 A | * | 6/1965 | Parris | 165/183 |
| 3,216,095 A | * | 11/1965 | Kurtz et al. | 165/183 |
| 3,543,069 A | * | 11/1970 | Schmidt | 165/183 |
| 5,509,465 A | * | 4/1996 | Lai | 165/80.3 |
| 6,006,827 A | * | 12/1999 | Lu | 165/185 |
| 6,382,307 B1 | * | 5/2002 | Wang et al. | 165/80.3 |

* cited by examiner

Primary Examiner—Henry Bennett
Assistant Examiner—Terrell McKinnon
(74) Attorney, Agent, or Firm—Bacon & Thomas, PLLC (57) ABSTRACT

A heatsink device includes a plurality of heatsink plates (1, 4, 5, 6) each made of heat conductive material. Each of the heatsink plates (1, 4, 5, 6) is formed with at least one through hole (11, 41, 51, 61). A periphery of the through hole (11, 41, 51, 61) is formed by an annular wall (12, 52) or sidewalls 62 which defining a opening(13, 53, 63). A heat conductive post (2, 7) formed as a rod and made of heat conductive material, the heat conductive post (2, 7) is forced to fittingly insert into the through hole (11, 41, 51, 61), so that the heat conductive post (2, 7) may be combined with the heatsink plates (1, 4, 5, 6) more rigidly and stably.

6 Claims, 8 Drawing Sheets

HEATSINK DEVICE

BACKGROUND OF THE INVENTION

1. Field of the Invention

The present invention relates to a heatsink device, and more particularly to a heatsink device for dissipating the heat produced from a heat emitting body, such as a central processor of a computer, wherein the heatsink device may be manufactured and assembled easily, and the parts may be combined more rigidly and stably after assembly.

2. Description of the Related Art

Figure 1:
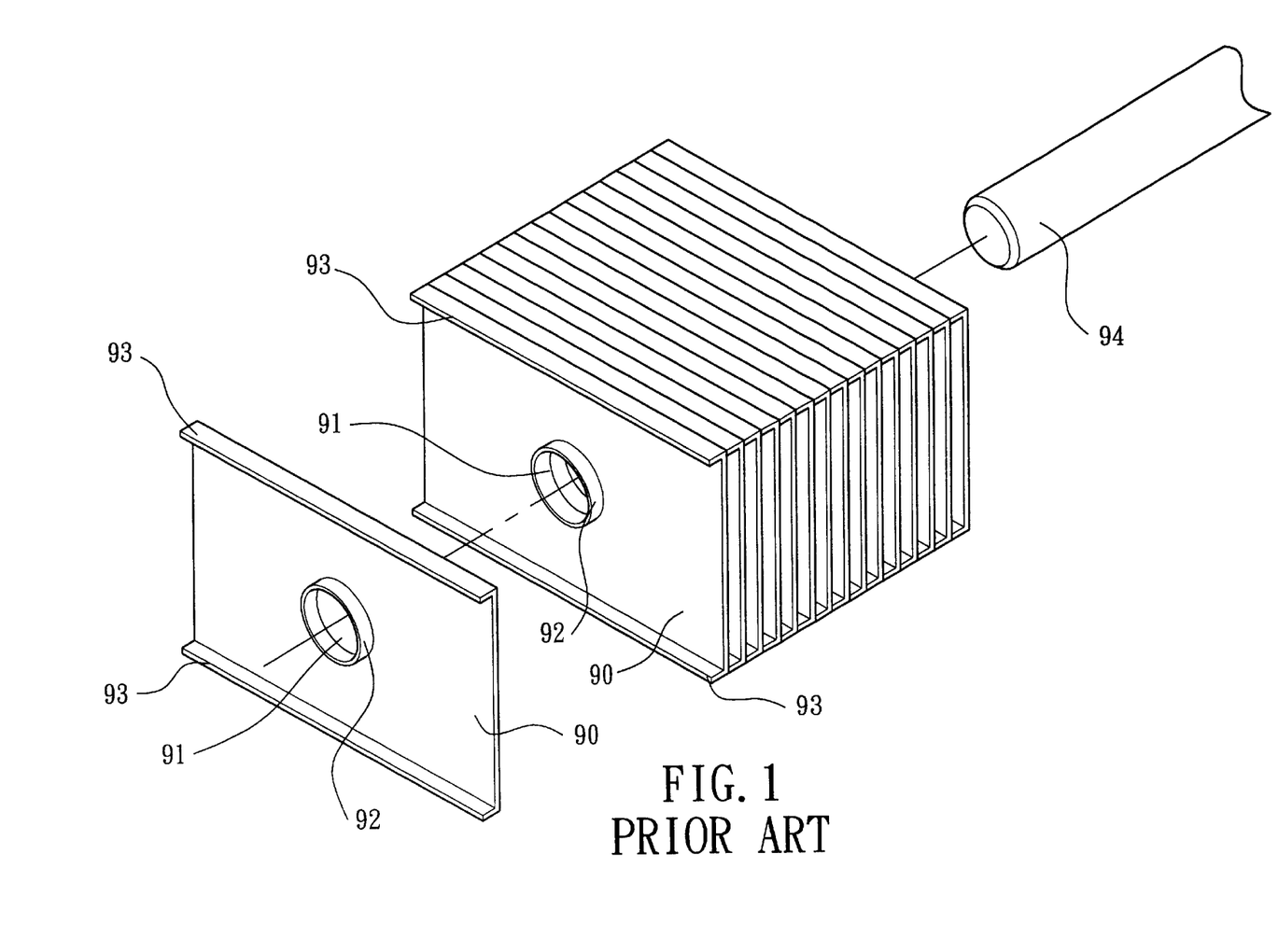
FIG. 1 is an exploded perspective view of a conventional heatsink device in accordance with the prior art.

A conventional heatsink device in accordance with the prior art shown in FIG. 1 comprises a plurality of heatsink plates 90 combined with each other. Each of the heatsink plates 90 is preferably made of heat conductive feature, such as copper. Each of the heatsink plates 90 is formed with a through hole 91 which has a periphery formed with a protruding annular wall 92. Each of the heatsink plates 90 has two sides each provided with a leg 93, so that the multiple heatsink plates 90 may be separated by the legs 93. The through holes 91 of the multiple heatsink plates 90 are aligned with each other for passage of a heat conductive post 94. One end of the heat conductive post 94 may be bonded on a heat emitting body, such as a central processor, so that the heat produced from the heat emitting body may be conducted through the heat conductive post 94 to the multiple heatsink plates 90, and may be conveyed outward to the environment.

The outer diameter of the heat conductive post 94 is greater than the inner diameter of the inner wall 92 of each of the heatsink plates 90, whereby the heat conductive post 94 may be forced into the inner wall 92 of each of the heatsink plates 90 in a close fit by a diameter difference, so that the heat conductive post 94 may be combined with the multiple heatsink plates 90. Thus, when the diameter difference of the heat conductive post 94 and the inner wall 92 of each of the heatsink plates 90 is greater, the heat conductive post 94 cannot be forced into the inner wall 92 of each of the heatsink plates 90 easily, and when the diameter difference of the heat conductive post 94 and the inner wall 92 of each of the heatsink plates 90 is smaller, the heat conductive post 94 cannot combined with the inner wall 92 of each of the multiple heatsink plates 90 rigidly, and the heat conductive material is worse relatively.

SUMMARY OF THE INVENTION

The primary objective of the present invention is to provide a heatsink device, wherein the heat conductive post may be combined with the heatsink plates easily and conveniently.

A secondary objective of the present invention is to provide a heatsink device, wherein the heat conductive post may be combined with the heatsink plates more rigidly and stably.

In accordance with the present invention, there is provided a heatsink device that includes a plurality of heatsink plates each made of heat conductive material. Each of the heatsink plates if formed with at least one through hole. A periphery of the through hole is formed by an annular wall or sidewalls which define at least one opening. A heat conductive post formed as a rod and made of heat conductive material is forced to fittingly insert into the through hole, so that the heat conductive post may be combined with the heatsink plates more rigidly and stably.

Further benefits and advantages of the present invention will become apparent after a careful reading of the detailed description with appropriate reference to the accompanying drawings.

DETAILED DESCRIPTION OF THE PREFERRED EMBODIMENTS

Figure 2:
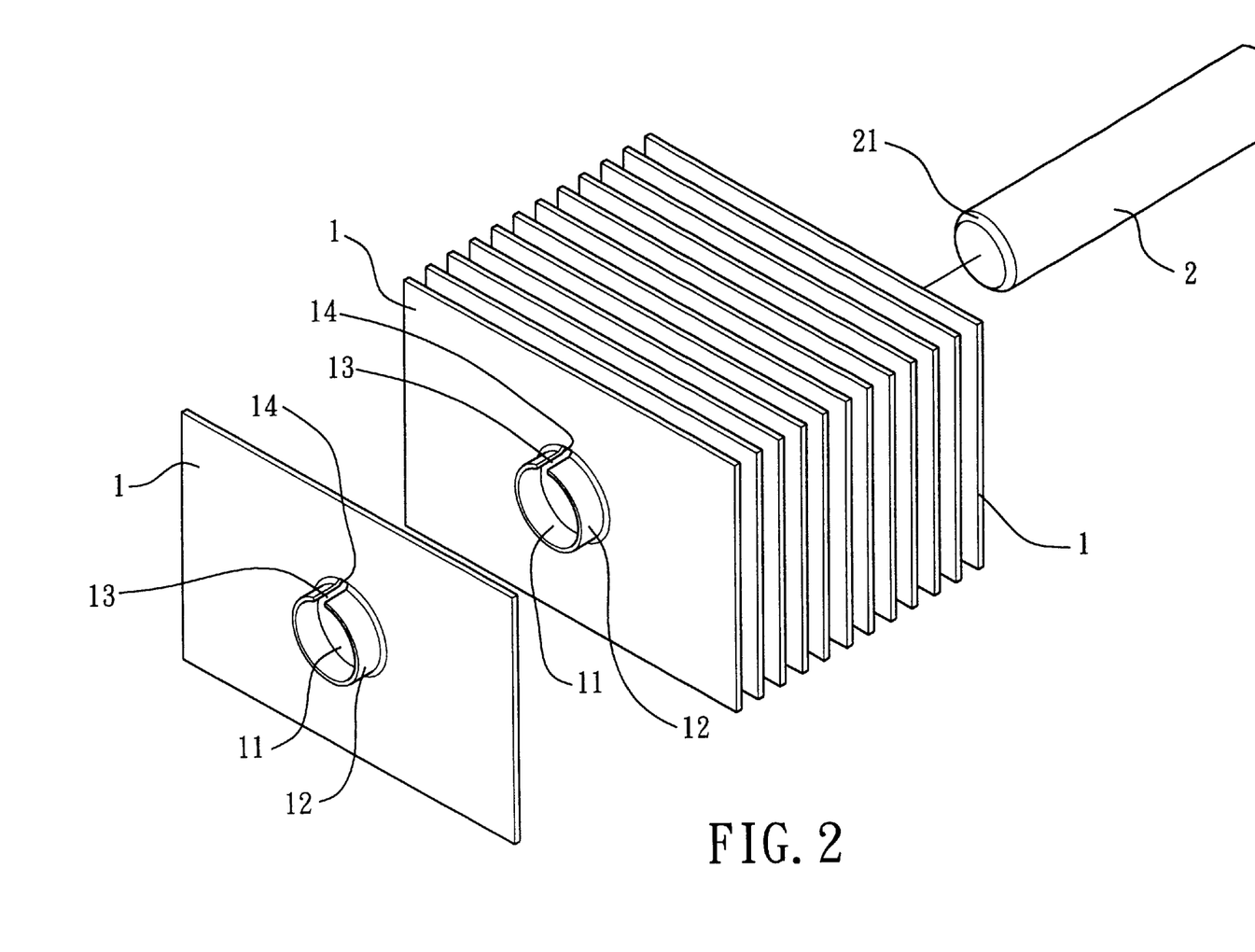
FIG. 2 is an exploded perspective view of a heatsink device in accordance with a first embodiment of the present invention.

Referring to the drawings and initially to FIG. 2, a heatsink device in accordance with a first embodiment of the present invention comprises a plurality of heatsink plates 1, and a heat conductive post 2.

Each of the heatsink plates 1 is preferably made of heat conductive material, such as copper. Each of the heatsink plates 1 is formed with at least one through hole 11 having a periphery defining an opening 13. The through hole 11 is formed by an annular wall 12. The annular wall 12 has at least one opening 13 that is formed in a top end of the annular wall 12, and a bottom portion of the annular wall 12 as a cone-shaped hole 14 whose diameter is greater than that of the annular wall 12.

The heat conductive post 2 formed as a rod is preferably made of heat conductive material, such as copper. Preferably, the heat conductive post 2 has a cross-section identical with that of the through hole 11. As shown in the figure, the heat conductive post 2 is a circular rod, and has a diameter slightly greater than an inner diameter of the through hole 11 or the annular wall 12 of each of the heatsink plates 1. The heat conductive post 2 may be forced to fittingly insert into the through hole 11 of each of the heatsink plates 1. In addition, the heat conductive post 2 has an insertion end formed with a chamfer 21, so that the heat conduction post 2 may be inserted into the through hole 11 and the annular wall 12 of each of the heatsink plates 1 easily and conveniently.

Figure 3:
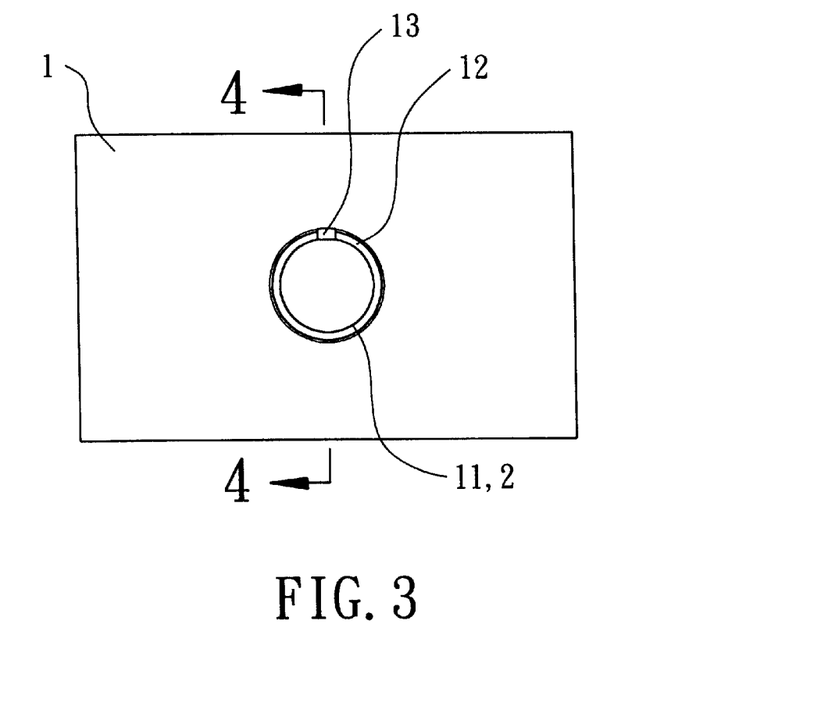
FIG. 3 is a front plan assembly view of the heatsink device as shown in FIG. 2.
Figure 4:
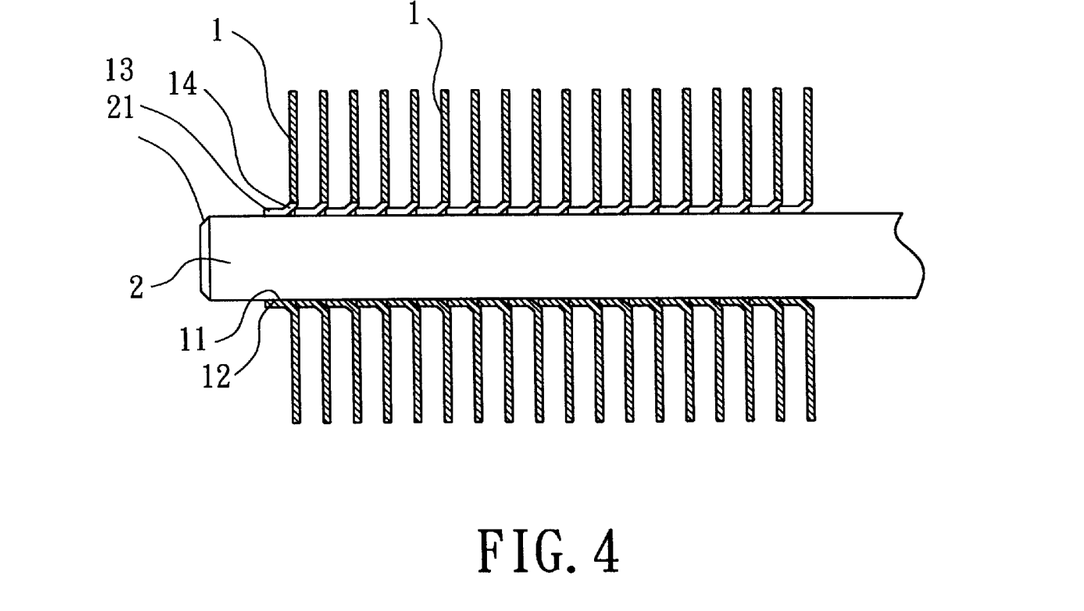
FIG. 4 is a cross-sectional view of the heatsink device taken along line 4—4 as shown in FIG. 3.

Referring to FIGS. 3 and 4, the heatsink device in accordance with the first embodiment of the present invention is assembled. The through holes 11 of the heatsink plates 1 are initially aligned with each other. Then, the heat conductive post 2 may be inserted into the aligned through holes 11 of the heatsink plates 1, and the heatsink plates 1 may be pushed on the heat conductive post 2, so that the top end of the annular wall 12 of each of the heatsink plates 1 may be rested on the cone-shaped hole 14 of an adjacent heatsink plate 1. Thus, the multiple heatsink plates 1 may maintain a determined distance therebetween. Further, the annular wall 12 formed on the periphery of the through hole 11 of each of the heatsink plates 1 has at least one opening 13, so that the annular wall 12 may be opened and closed in an elastic manner. Thus, the heat conductive post 2 may be inserted into the through hole 11 and the annular wall 12 of each of the heatsink plates 1 easily and conveniently, and the heat conductive post 2 may be combined with the heatsink plates 1 rigidly and stably.

Figure 5:
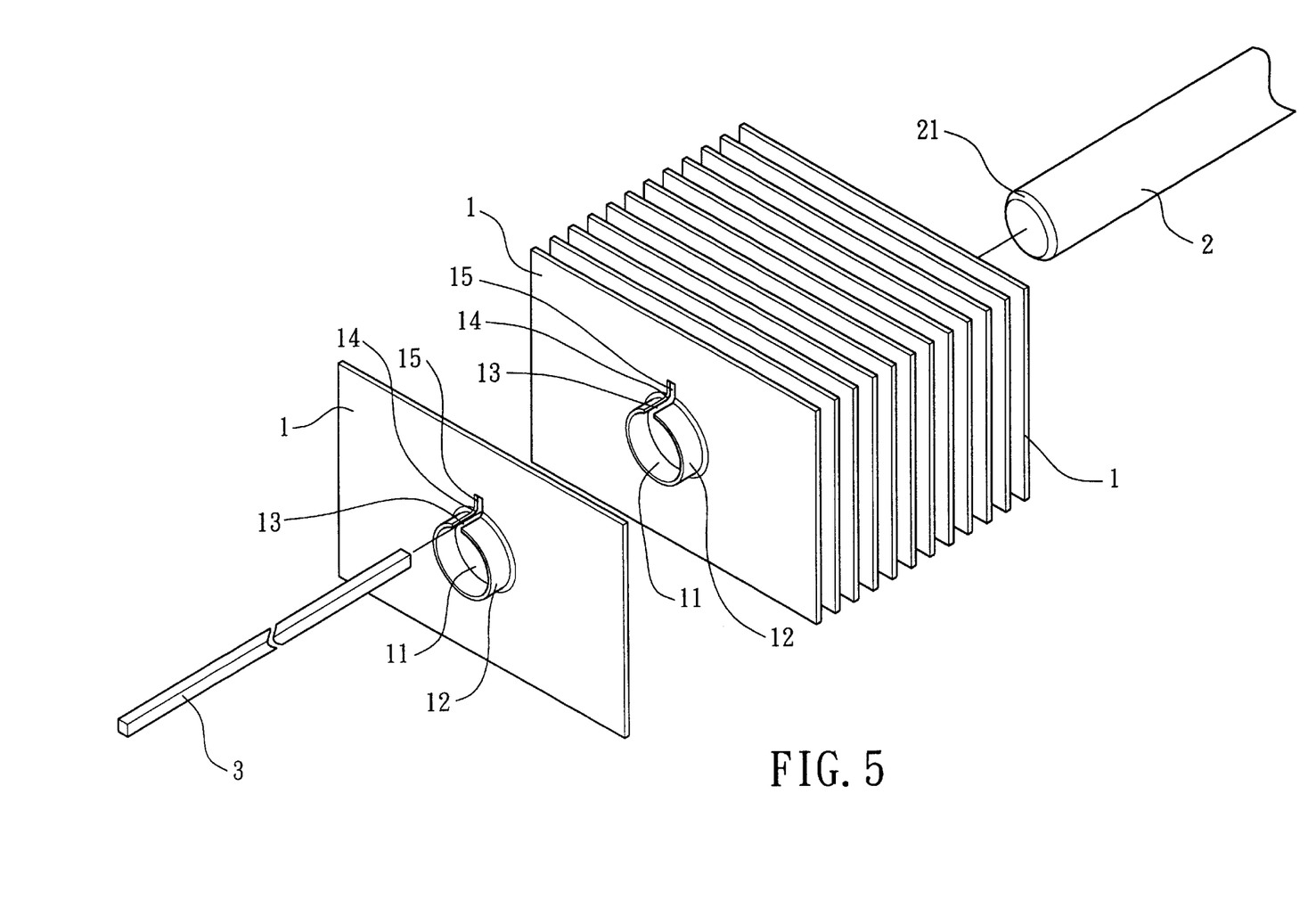
FIG. 5 is an exploded perspective view of a heatsink device in accordance with a second embodiment of the present invention.
Figure 6:
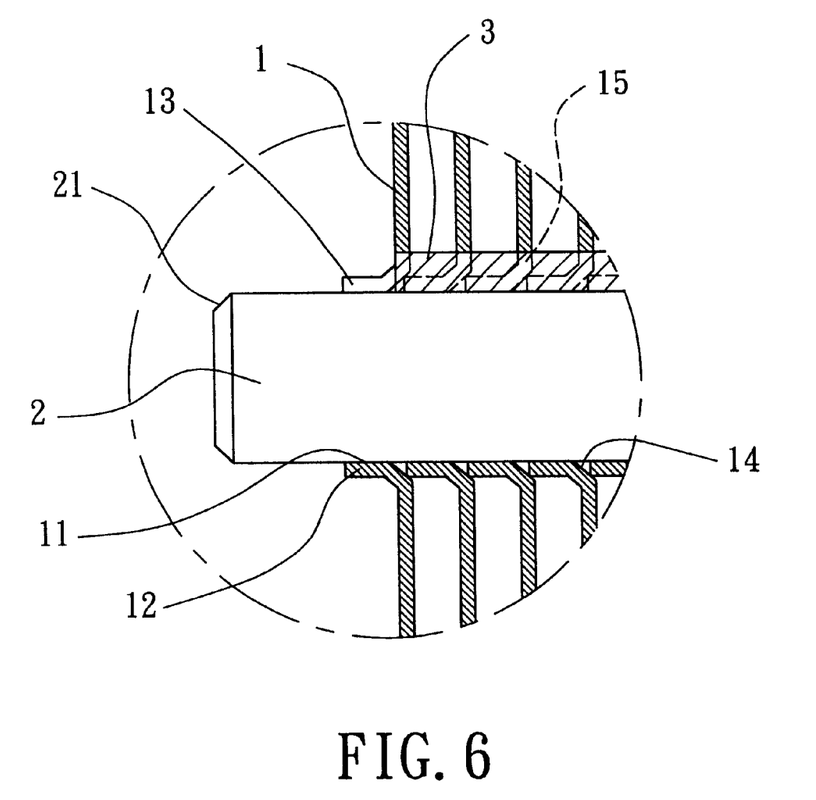
FIG. 6 is a partially cut-away plan assembly view of the heatsink device as shown in FIG. 5.

Referring to FIGS. 5 and 6, a heatsink device in accordance with a second embodiment of the present invention comprises a plurality of heatsink plates 1, a heat conductive post 2, and a fixing bar 3. Each of the heatsink plates 1 also has a through hole 11, an annular wall 12, an opening 13, and a bottom portion of the annular wall 12 as a cone-shaped hole 14. In the preferred embodiment of the present invention, the opening 13 formed on the annular wall 12 is further provided a fixing hole 15 radically extended outward the heatsink plate 1. Thus, after the heat conductive post 2 is inserted into the through hole 11 and the annular wall 12 of each of the heatsink plates 1, the fixing holes 15 of the heatsink plates 1 are aligned with each other, so that the fixing bar 3 may be inserted into the fixing holes 15 of the heatsink plates 1 in a close fit manner. Thus, the heat conductive post 2 may be combined with the heatsink plates 1 more rigidly and stably, and the heatsink plates 1 will not pivot relative to the heat conductive post 2. Especially, if the fixing bar 3 is made of low temperature weld material,; such as tin, the combined heatsink plates 1, heat conductive post 2 and fixing bar 3 may be heated, so as to melt the fixing bar 3, so that the heat conductive post 2 may be combined with the heatsink plates 1 more rigidly and stably.

Figure 7:
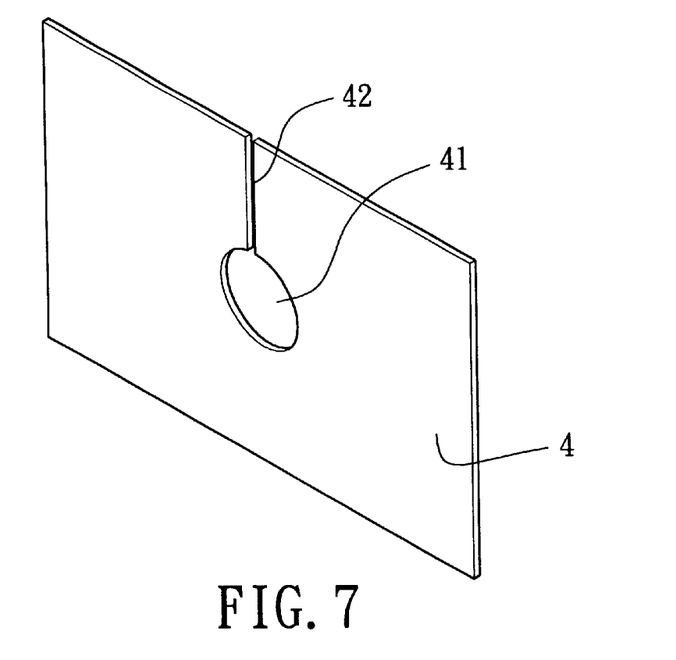
FIG. 7 is a perspective view of a heatsink device in accordance with a third embodiment of the present invention.

Referring to FIG. 7, a heatsink plate 4 in accordance with a third embodiment of the present invention is shown. The heatsink plate 4 is preferably made of heat conductive material, such as copper. The heatsink plate 4 is formed with at least one through hole 41 whose diameter is slightly smaller than that of the heat conductive post 2. The through hole 41 has an opening 42 radically extended outward from an edge of the heatsink plate 4 to an outer edge.

In the third embodiment of the present invention, the through holes 41 of the heatsink plates 4 are initially aligned with each other, and each of the heatsink plates 4 has the opening 42, so that the heat conductive post 2 may be combined with the heatsink plates 4 rigidly and stably. In addition, the heatsink plates 4 may be fixed by a fixing tool (not shown), so that the multiple heatsink plates 4 of the heatsink device may maintain a determined distance therebetween.

Figure 8:
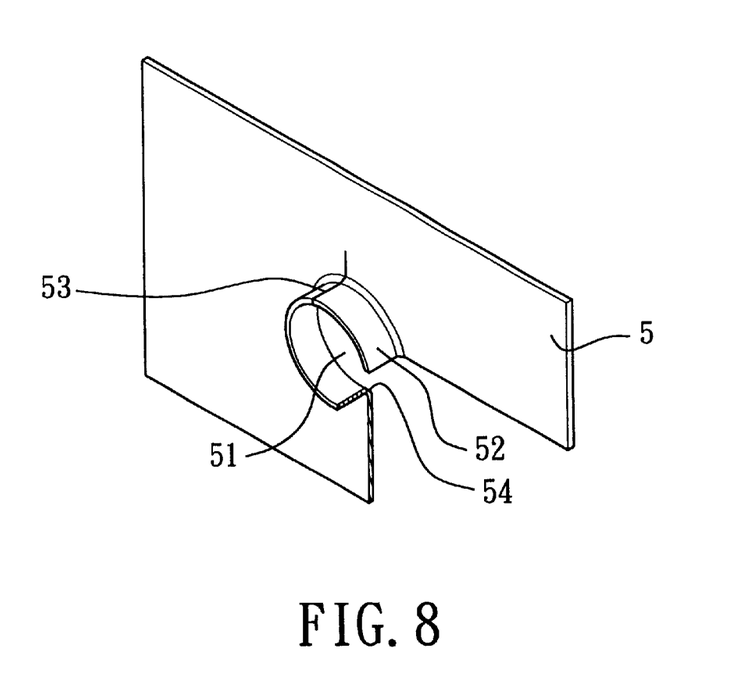
FIG. 8 is a perspective view of a heatsink device in accordance with a fourth embodiment of the present invention.

Referring to FIG. 8, a heatsink plate 5 in accordance with a fourth embodiment of the present invention is shown. The heatsink plate 5 is preferably made of heat conductive material, such as copper. The heatsink plate 5 is provided with at least one through hole 51. The periphery of the through hole 51 is formed by an annular wall 52. The annular wall 52 is provided with at least one slit 53 radially extended outward and connected to an inner edge of the heatsink plate 5. Thus, the annular wall 52 may be opened and closed in an elastic matter. A bottom portion of the annular wall 52 is formed as a cone-shaped hole 54, and the inner diameter of the through hole 51 could be smaller than the diameter of the het conductive post 2.

When the heat conductive post 2 is passed through the through hole 51 and the annular wall 52 of each of the heatsink plates 5, the heatsink plate 5 is formed with at least one slit 53 that may be opened and closed in an elastic manner, so that when the heat conductive post 2 is combined with each of the heatsink plates 5, the heat conductive post 2 may be combined with each of the heatsink plates 5 rigidly and stably. In addition, the top end of the annular wall 52 of each of the heatsink plates 5 may be rested on the cone-shaped hole 54 of an adjacent heatsink plate 5. Thus, the heatsink plates 5 may maintain an equal distance therebetween.

Figure 9:
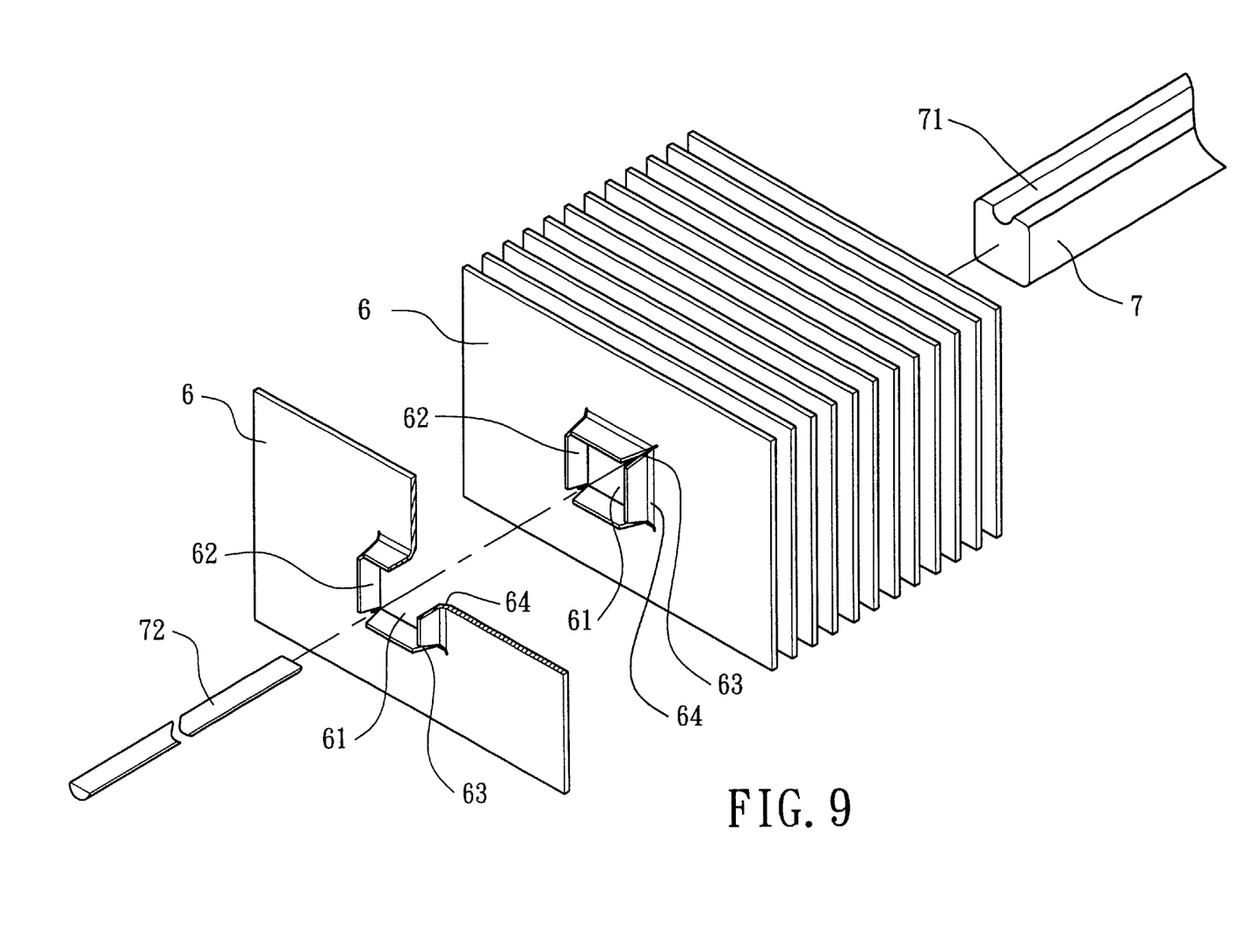
FIG. 9 is an exploded perspective view of a heatsink device in accordance with a fifth embodiment of the present invention.

Referring to FIG. 9, a heatsink device in accordance with a fifth embodiment of the present invention comprises a plurality of heatsink plates 6, and a heat conductive post 7.

Each of heatsink plates 6 is preferably made of heat conductive material, such as copper. Each of the heatsink plates 6 is formed with at least one through hole 61. The through hole 61 is consisted of at least three sidewalls 62, preferably triangle, square or polygon. Each of the sides of the through hole 61 has the sidewall 62 that may be formed by bending the through hole 61 during the punching process of the through hole 61. The sidewalls 62 are slightly inclined toward the direction of the center of the through hole 61. The openings 63 is defined by any two adjacent sidewalls 62. The bottom portion of the sidewall 62 is formed with a inclined portion 64 connected to the heartsink 6. That is, the inclined portion 64 is provided on a bottom portion of the sidewall 62.

Figure 10:
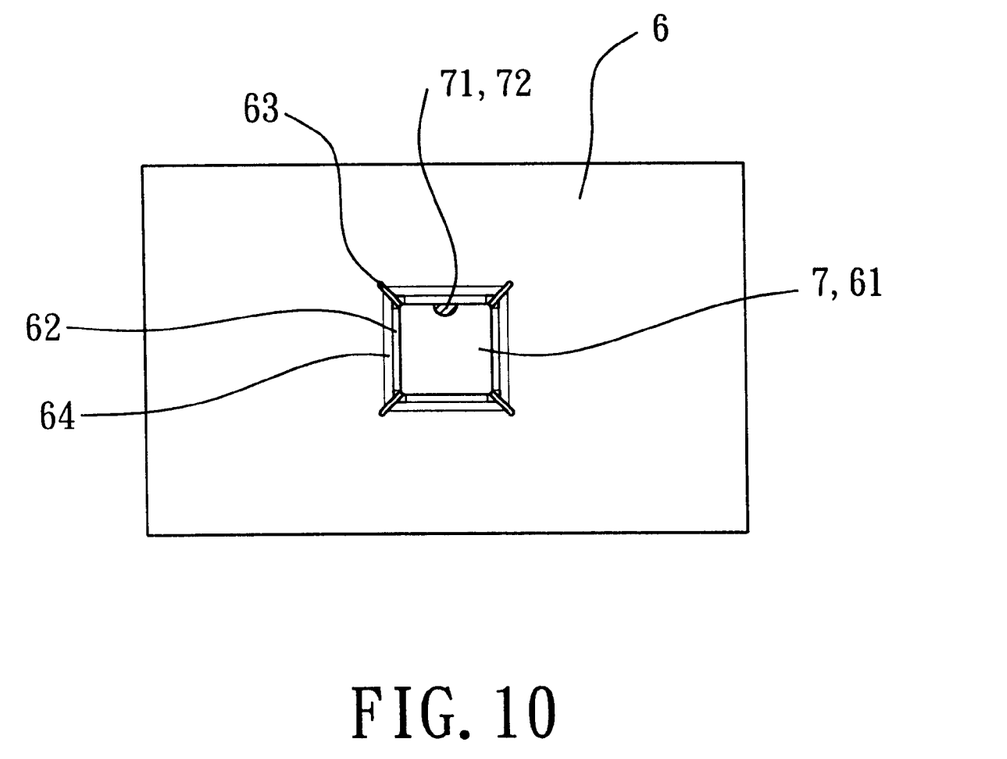
FIG. 10 is a front plan assembly view of the heatsink device as shown in FIG. 9.

The heat conductive post 7 is formed as a rod, and is preferably made of heat conductive material, such as copper. The heat conductive post 7 is passed through the through hole 61, and is passed through the sidewalls 62 of each of the heatsink plates 6 in a close fit manner, so that the heatsink plates 6 may be combined with the heat conductive post 7 via the top end of the sidewalls 62 of each of the adjacent heatsink plates 6. Preferably, the heat conductive post 7 has a cross-section identical with that of the through hole 61. As shown in the figure, both the heat conductive post 7 and the through hole 61 of each of the heatsink plates 6 are square. If necessary, the heat conductive post 7 may be provided a channel 71 for fittingly receiving a fixing bar 72 as shown in FIG. 10, so that the heat conductive post 7 and each of the heatsink plates 6 may be combined more rigidly and stably. In addition, if the fixing bar 72 is made of low weld temperature material, such as tin, the combined heatsink plates 6, heat conductive post 7 and fixing bar 72 may be heated, so as to melt the fixing bar 72, so that the heat conductive post 7 may be combined with the heatsink plates 6 more rigidly and stably.

Accordingly, in the heatsink device in accordance with the present invention, the heat conductive post may be combined with the heatsink plates rigidly and stably in an easy and convenient manner. Especially, when the opening of the heatsink plate is extended and formed with a fixing hole in the heatsink plate, a fusible material having a lower melting temperature may be placed and melted in the fixing hole, so that the heat conductive post may be combined with the heatsinik plates more rigidly and stably. In addition, after the heat conductive post is combined with the heatsink plates, the multiple heatsink plates may maintain an equal distance therebetween.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A heatsink device, comprising:
   a plurality of heatsink plates, each made of heat conductive material and being formed with at least one through hole, the through hole consisting of at least three sidewalls, and the opening being defined by any two adjacent said sidewalls; and
   a heat conductive post formed as a rod and made of heat conductive material, the heat conductive post being forced to be fittingly inserted into the through hole.

2. The heatsink device as claimed in claim 1, wherein the sidewalls are inclined to a center of the through hole.

3. The heatsink device as claimed in claim 1, wherein the heat conductive post has a cross-section identical with that of the through hole.

4. The heatsink device as claimed in claim 1, wherein the heat conductive post is further provided with a channel for fittingly receiving a fixing bar.

5. The heatsink device as claimed in claim 4, wherein the fixing bar is made of low temperature weld material.

6. The heatsink device as claimed in claim 1, wherein an inclined portion is provided on the bottom portion of the sidewall.

* * * * *